(12) United States Patent  (10) Patent No.: US 9,163,810 B2
Katoh et al.  (45) Date of Patent: Oct. 20, 2015

(54) LIGHT EMITTING DEVICE AND BACKLIGHT DEVICE

(71) Applicant: SHARP KABUSHIKI KAISHA, Osaka-shi, Osaka (JP)

(72) Inventors: Masaaki Katoh, Osaka (JP); Masaki Kondoh, Osaka (JP)

(73) Assignee: SHARP KABUSHIKI KAISHA, Osaka-shi, Osaka (JP)

( * ) Notice: Subject to any disclaimer, the term of this patent is extended or adjusted under 35 U.S.C. 154(b) by 0 days.

(21) Appl. No.: 14/385,014

(22) PCT Filed: Feb. 28, 2013

(86) PCT No.: PCT/JP2013/055439
§ 371 (c)(1),
(2) Date: Sep. 12, 2014

(87) PCT Pub. No.: WO2013/137005
PCT Pub. Date: Sep. 19, 2013

(65) Prior Publication Data
US 2015/0043245 A1    Feb. 12, 2015

(30) Foreign Application Priority Data
Mar. 13, 2012 (JP) .................................. 2012-055669

(51) Int. Cl.
*F21V 15/01* (2006.01)
*H01L 33/62* (2010.01)
*F21V 19/00* (2006.01)
*F21V 8/00* (2006.01)

(52) U.S. Cl.
CPC ............... *F21V 15/01* (2013.01); *F21V 19/002* (2013.01); *G02B 6/009* (2013.01); *G02B 6/0073* (2013.01); *H01L 33/62* (2013.01); *G02B 6/0023* (2013.01); *H01L 2224/48091* (2013.01); *H01L 2224/48247* (2013.01)

(58) Field of Classification Search
USPC ....................................... 362/612, 613, 249.02
See application file for complete search history.

(56) References Cited

U.S. PATENT DOCUMENTS

2004/0046242 A1*  3/2004  Asakawa ...................... 257/678
2008/0054284 A1   3/2008  Hussell et al.
2008/0191327 A1   8/2008  Asakawa et al.
(Continued)

FOREIGN PATENT DOCUMENTS

JP    2007-012727    1/2007
JP    2007-096240    4/2007
(Continued)

OTHER PUBLICATIONS

International Search Report for PCT/JP2013/055439, mailed Apr. 23, 2013.

*Primary Examiner* — Laura Tso
(74) *Attorney, Agent, or Firm* — Nixon & Vanderhye, P.C.

(57) ABSTRACT

A light emitting device has a lead frame which has a lead frame body and a plurality of bumper sections raised from the lead frame body. A rectangular case member with a hole is mounted to the lead frame. A light emitting element is placed in the hole of the case member, which is filled with a sealing resin that seals the light emitting element. The bumper sections are arranged on two opposite sides of the case member. Tip surfaces of the bumper sections are at a level higher than or equal to an upper end surface of the case member.

8 Claims, 11 Drawing Sheets

(56) References Cited

U.S. PATENT DOCUMENTS

| | | | |
|---|---|---|---|
| 2008/0304288 A1* | 12/2008 | Iwasaki | 362/632 |
| 2009/0289275 A1 | 11/2009 | Hayashi | |
| 2010/0290248 A1* | 11/2010 | Park | 362/606 |
| 2011/0170019 A1 | 7/2011 | Shimizu | |
| 2011/0285937 A1* | 11/2011 | Onoue et al. | 349/62 |
| 2012/0249922 A1* | 10/2012 | Chang et al. | 349/62 |
| 2012/0262647 A1* | 10/2012 | Hu et al. | 349/65 |
| 2013/0070479 A1* | 3/2013 | Ito | 362/609 |

FOREIGN PATENT DOCUMENTS

| | | |
|---|---|---|
| JP | 2008-135701 | 6/2008 |
| JP | 2008-198807 | 8/2008 |
| JP | 2008-277065 | 11/2008 |
| JP | 2011-034674 | 2/2011 |
| JP | 2011-134902 | 7/2011 |
| WO | WO 2008/081696 | 7/2008 |
| WO | WO 2009/098797 | 8/2009 |
| WO | WO 2010/041498 | 4/2010 |

* cited by examiner

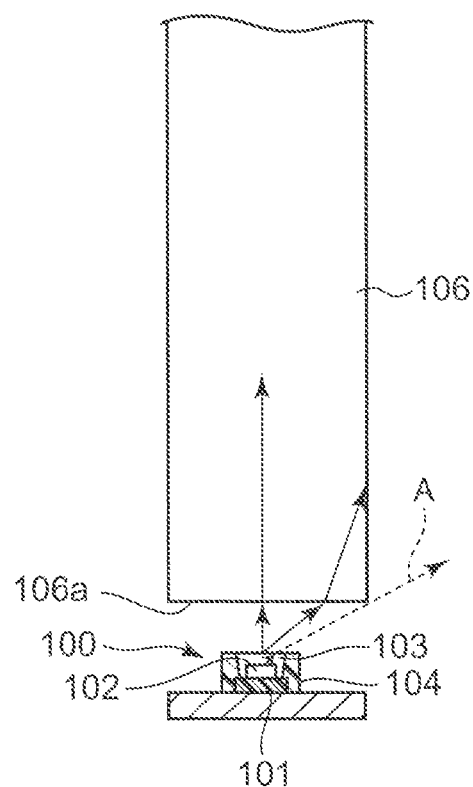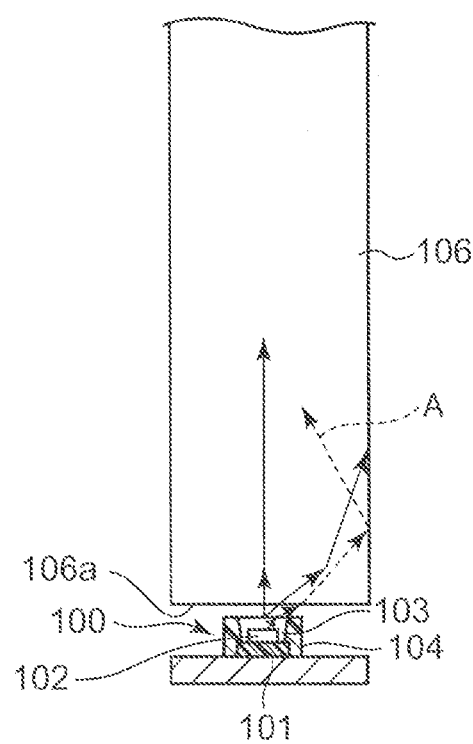

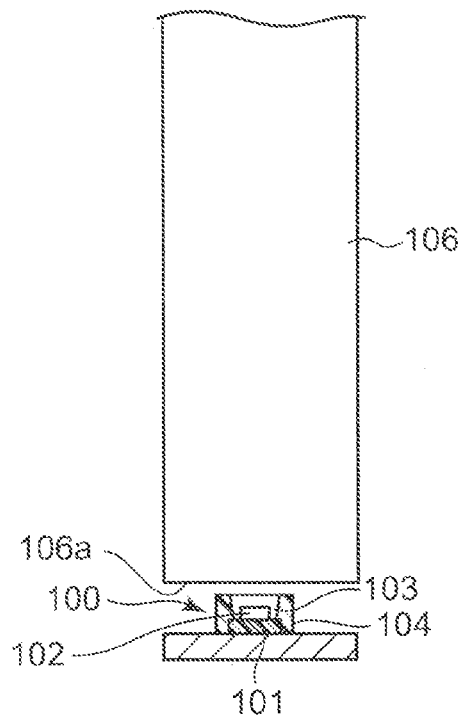
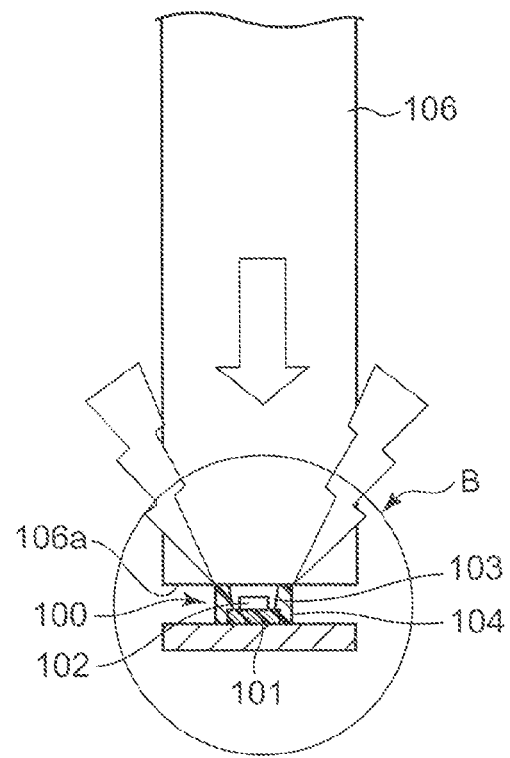

LIGHT EMITTING DEVICE AND BACKLIGHT DEVICE

This application is the U.S. national phase of International Application No. PCT/JP2013/055439, filed 28 Feb. 2013, which designated the U.S. and claims priority to JP Application No. 2012-055669, filed 13 Mar. 2012; the entire contents of each of which are hereby incorporated by reference.

TECHNICAL FIELD

The present invention relates to a light emitting device and a backlight device.

BACKGROUND ART

There is a conventional light emitting device as shown in FIGS. 6A and 6B (see JP 2011-34674 A (PTL 1)).

The light emitting device 100 shown in FIGS. 6A and 6B has a lead frame 101, a light emitting element 102 on the lead frame 101, a sealing resin 103 on the lead frame 101 for sealing the light emitting element 102, and a case member 104 made of resin for covering the sides of the sealing resin 103. The lead frame 101 and the light emitting element 102 are connected to each other by wires 105. An upper end surface 103a of the sealing resin 103 defines an aperture through which light emitted from the light emitting element 102 goes out.

The light emitting device 100 has been used as a backlight device, as shown in FIG. 7. As shown in FIG. 7, a plurality of light emitting devices 100 are arranged in a line and a light guide body 106 is disposed opposite to the upper end surfaces 103a of the sealing resins 103 of the light emitting devices 100.

The light guide body 106 is plate-shaped and has an end surface 106a opposed to the upper end surfaces 103a of the sealing resins 103 of the light emitting devices 100. Light emitted through the upper end surfaces 103a of the sealing resins 103 is taken into the light guide body 106 through the end face 106a of the light guide body 106. Then, the light is diffused and reflected within the light guide body 106 and taken out through a planar surface 106b of the light guide body 106. The light taken out through the planar surface 106b is used as backlight for liquid crystal panels and advertisement films.

As shown in FIG. 8, the backlight device is designed such that there is a space or interval of about 1 mm between the light emitting devices 100 and the light guide body 106 in order to prevent the light guide body 106 from directly touching the light emitting devices 100.

FIG. 9A shows a sectional view of the backlight device taken perpendicularly to a thickness direction of the light guide body 106. FIG. 9A shows a normal positional relationship between the light emitting device 100 and the light guide body 106 in which there is a sufficient spacing or interval therebetween to avoid a possible collision of the light emitting device 100 and the light guide body 106. In the state shown in FIG. 9A, a portion of a light beam emitted from the light emitting element 102 of the light emitting device 100 does not enter the light guide body 106, as indicated by dotted arrow A.

FIG. 9B shows a state that the light guide body 106 is positioned closer to the light emitting device 100 than when the light guide body 106 and the light emitting device 100 assume their positions shown in FIG. 9A. In the state shown in FIG. 9B, the portion of the light beam that does not enter the light guide body 106 in the state shown FIG. 9A is now allowed to enter the light guide body 106 as indicated by dotted arrow A.

As is apparent from above, a shorter distance between the light emitting device 100 and the light guide 106 enables light from the light emitting device 100 to enter the light guide body 106 with increased efficiency.

If, however, the light emitting device 100 is approached to the light guide body 106 to the extent that the light emitting device 100 nearly touches the light guide body 106 as shown in FIG. 10A, when the light emitting device 100 turns on or a surrounding temperature rises, there is a risk of collision of the light guide body 106 against the light emitting device 100 due to thermal expansion of the light guide body 106 as shown by an arrow in FIG. 10B.

When the end surface 106a of the light guide body 106 collides against the case member 104 of the light emitting device 100, there raises a problem that the case member 104 may have cracks C as shown in FIG. 11 if the case member 104 does not have enough strength. Also, the cracks may cause breaking or disconnection of the wires 105 (shown in FIG. 6B) within the sealing resin 103.

The above problems can happen for real. Thus, regarding planned dimensions, a very important selection must be made between increase of an amount of light incident upon the light guide body 106 and reduction of probability of the risk of wire breaking or disconnection due to the thermal expansion of the light guide body 106.

CITATION LIST

Patent Literature

PTL 1: JP 2011-34674 A

SUMMARY OF INVENTION

Technical Problem

Therefore, the present invention aims at providing a light emitting device and a backlight device which enables an increased amount of light to be entered into a light guide body while reducing the probability of occurrence of wire breaking or disconnection due to the thermal expansion of the light guide body.

Solution to Problem

A light emitting device according to the present invention provides a light emitting device including:

a lead frame having a lead frame body and bumper sections raised from the lead frame body;

a case member having a bottom surface attached to the lead frame body, the case member also having a hole;

a light emitting element placed in the hole of the case member, the light emitting element being mounted to the lead frame body; and a sealing resin filled in the hole of the case member and sealing the light emitting element, tip surfaces of the bumper sections being at a level higher than or equal to an upper end surface of the case member.

By the term "upper end surface" is meant an end surface directed to a direction to which light from the light emitting element goes out.

According to the light emitting device of the invention, when a light guide body is placed opposite to the upper end surface of the sealing resin with a small interval therebetween, the light guide body may collide against the light emitting device due to thermal expansion.

In such an occasion, however, because the tip surfaces of the bumper sections are at a higher level than the upper end surface of the case member, the bumper sections are brought into contact with the light guide body and receive forces or loads from the light guide body. Thus, the bumper sections prevent forces or loads of the light guide body from being transmitted to the case member.

As a result, it is possible to prevent the case member from suffering from damages such as cracks and hence to prevent wire within the case member and the sealing resin from breaking.

Accordingly, it is possible to place the light guide body so close to the light emitting device that light emitted from the light emitting device can be efficiently led to the light guide body. At the same time, it is possible to prevent disconnection, or wire breaking, of the light emitting device from occurring even if the light guide body collides with the light emitting device due to its thermal expansion.

In one embodiment, each bumper section has been formed by bending a portion of the lead frame.

In this embodiment, because the bumper sections are formed by bending portions of the lead frame, the bumper sections can be made easily.

In one embodiment, the bumper sections are arranged orthogonal to the lead frame body.

In this embodiment, because the bumper sections are arranged to extend orthogonally, or perpendicularly to the lead frame body, a direction of forces of the thermally expanded light guide body to be received by the bumper sections can be consistent with the orthogonal direction in which the bumper sections extend relative to the lead frame body. Therefore, the light guide body is prevented from exerting loads of bending forces upon the bumper sections. As a result, the bumper sections can reliably support or bear the light guide body.

In one embodiment, the lead frame body has a terminal section extending along a surface direction from an end of the lead frame body, the terminal section being exposed from the case member, and the bumper sections are contiguous to the terminal section.

In this embodiment, because the bumper sections are connected to the terminal section, heat of the light emitting element is discharged not only through the terminal section but also through the bumper sections.

In one embodiment, the lead frame body has a terminal section extending along a surface direction from an end of the lead frame body, the terminal section being exposed from the case member. Also, the bumper sections are contiguous to portions of the lead frame body where the terminal section does not exist, and the bumper sections penetrate the case member.

In this embodiment, because the bumper sections penetrate the case member, spaces for installation of the bumper sections can be reduced.

In one embodiment, the lead frame body has a terminal section extending along a surface direction from an end of the lead frame body, the terminal section being exposed from the case member. Also, the bumper sections are contiguous to end portions of the lead frame body where the terminal section does not exist, and the bumper sections are exposed from the case member.

In this embodiment, because the bumper sections are contiguous to, or connected to portions of the lead frame body where no terminal section exists, and the bumper sections are exposed from the case member, heat of the light emitting element is discharged not only through the terminal section but also through the bumper sections. Also, the light emitting device can be placed with the bumper sections facing downward, so that the light emitting device can be used as a side-emission type light emitting device.

A backlight device according to an embodiment of the invention includes a light emitting device as described above, and a light guide body placed so as to be opposed to an upper end surface of the sealing resin of the light emitting device.

The backlight device of this embodiment, which includes the light emitting devices as described above, can provide good optical efficiency and avoid breaking of wires.

Advantageous Effects of Invention

Due to the tip surfaces of the bumper sections being at a level higher than or equal to the upper end surface of the case member, the light emitting device according to the invention enables an increased amount of light to be entered into the light guide body while reducing the probability of occurrence of wire breaking or disconnection caused by the thermal expansion of the light guide body.

The backlight device according to this invention, which includes the light emitting device as described above, can provide good optical efficiency and avoid breaking of wires.

BRIEF DESCRIPTION OF DRAWINGS

FIG. 9A shows an explanatory cross sectional view of the backlight device, illustrating leakage of a portion of a light beam directed from the light emitting device to the light guide body;

FIG. 9B shows an explanatory cross sectional view of the backlight device, illustrating the improvement of the leakage of light directed from the light emitting device to the light guide body;

FIG. 10A shows a cross sectional view of the backlight device, showing that the light emitting device is positioned so close to the light guide body as to nearly touch the light guide body;

FIG. 10B shows a cross sectional view of the backlight device, showing that the light guide body is in contact with the light emitting device.

DESCRIPTION OF EMBODIMENTS

Figure 1A:
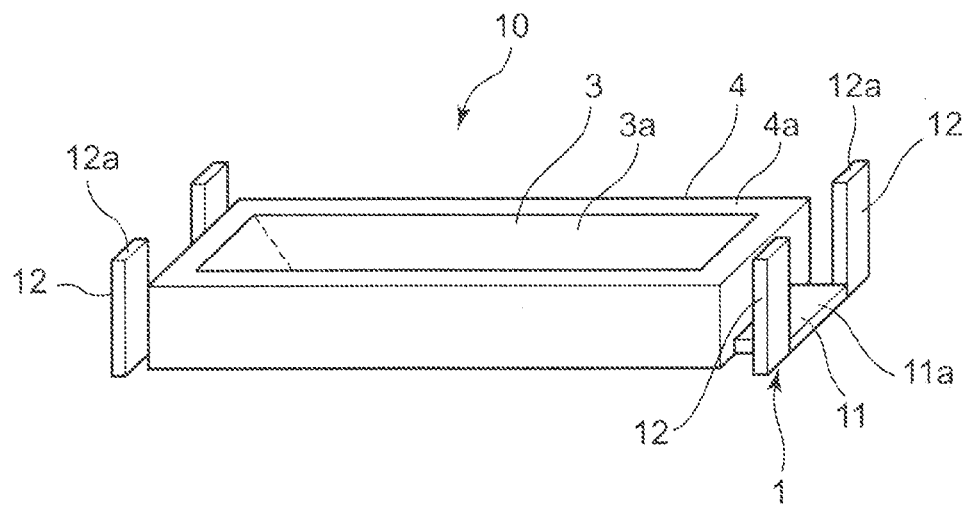
FIG. 1A shows a perspective view of a light emitting device according to a first embodiment of the present invention.

The present invention will be described below by embodiments shown in the drawings.

(First Embodiment)

Figure 1B:
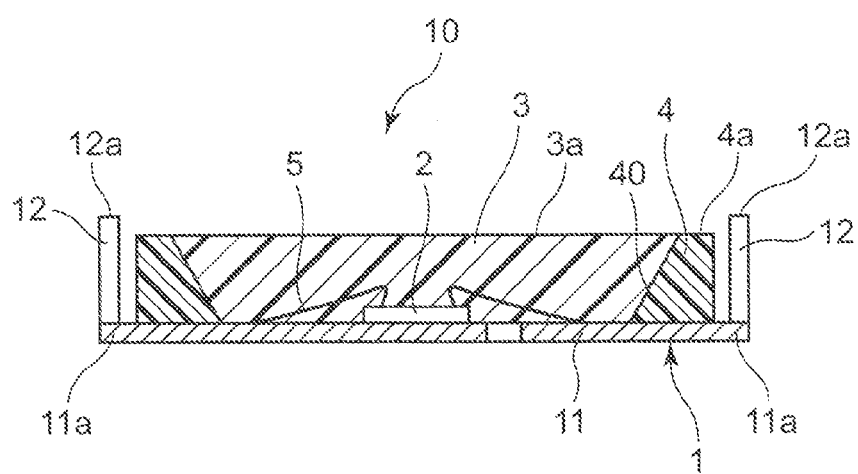
FIG. 1B shows a sectional view of the light emitting device of the first embodiment.

FIG. 1A shows a perspective view of a light emitting device according to a first embodiment of the present invention. FIG. 1B shows a sectional view of the light emitting device. As shown in FIGS. 1A and 1B, the light emitting device 10 has a lead frame 1, a case member 4, a light emitting element 2, and a sealing resin 3.

The lead frame 1 may be made of metal, and includes a lead frame body 11 and bumper sections 12 raised from the lead frame body 11.

The case member 4 may be made of resin, with a bottom surface of the case member 4 being attached to the lead frame body 11. For example, the case member 4 may be formed integrally with the lead frame 1 by insert molding.

The case member 4 has a hole 40. The light emitting element 2 is arranged within the hole 40. An inner surface of the case member 4 defining the hole 40 is an inclined surface such that the hole 40 becomes wider on an opening side thereof. Light emitted from the light emitting element 2 is reflected on the inclined surface. That is, the case member 4 serves also as a reflector.

The light emitting element 2 may be, for example, a semiconductor light emitting element such as an LED. The light emitting element 2 is die-bonded to the lead frame body 11. The light emitting element 2 and the lead frame body 11 are connected to each other by wires 5.

The sealing resin 3 may be made of a resin having light permeability. The sealing resin 3 fills the hole 40 of the case member 4 and seals or encapsulates the light emitting element 2. An upper end surface 3a of the sealing resin 3 defines an aperture through which light from the light emitting element 2 goes out. The sealing resin 3 may be mixed with a phosphor.

The lead frame body 11 has terminal sections 11a that protrude or extend from each of opposed ends of the lead frame body along a surface direction and are exposed from the case member 4. The terminal sections 11a may be soldered to a mount board. The lead frame body 11 is generally rectangular and the terminal sections 11a are provided at one of two pairs of opposed sides of the rectangular lead frame body 11.

The bumper sections 12 are contiguous to, or connected to the terminal sections 11a. The bumper sections 12 are arranged so as to meet the lead frame body at right angles, namely to be orthogonal, or perpendicular to the lead frame body 11. Each bumper section 12 is formed by bending a part of the lead frame 1 by 90 degrees. More specifically, the bumper sections 12 are originally formed or shaped when the material of the lead frame 1 is pressed, and the bumper sections 12 are bent by a press at the lead cutting stage after the insert molding process of the case member 4.

The bumper sections 12 are four in number, and these four bumper sections 12 are placed outside of the four corners of the rectangular case member 4 and exposed from the case member 4.

End surfaces 12a of each of the bumper sections 12 are at a higher level than the upper end surface 4a of the case member 4. The upper end surface 4a of the case member 4 is at a level equal to, or flush with the upper end surface 3a of the sealing resin 3. The upper end surfaces 3a, 4a are surfaces directed to a direction to which light from the light emitting element 2 goes out.

Figure 2A:
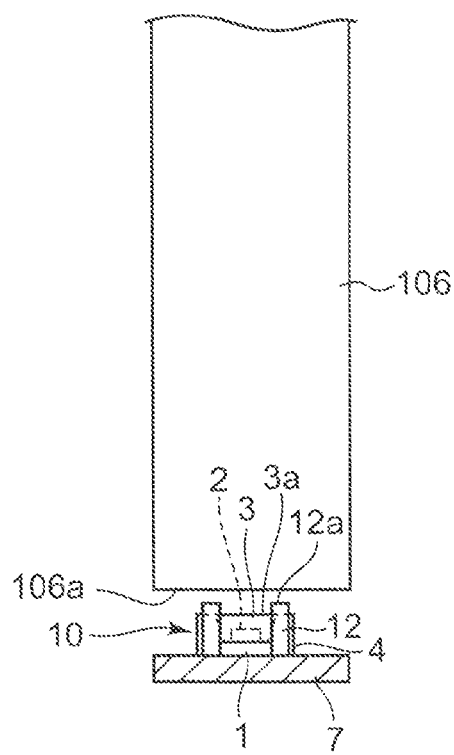
FIG. 2A shows a cross sectional view of a backlight device, showing that the light emitting device is positioned so close to a light guide body as to nearly touch the light guide body.

An application of the light emitting device 10 to a backlight device will be described below. The backlight device has light emitting devices 10 and a light guide body 106 disposed opposite to the upper end surfaces 3a of the sealing resins 3 of these light emitting devices 10, as shown in FIG. 2A. The light guide body 106 is the same as described with reference to FIG. 7.

Figure 7:
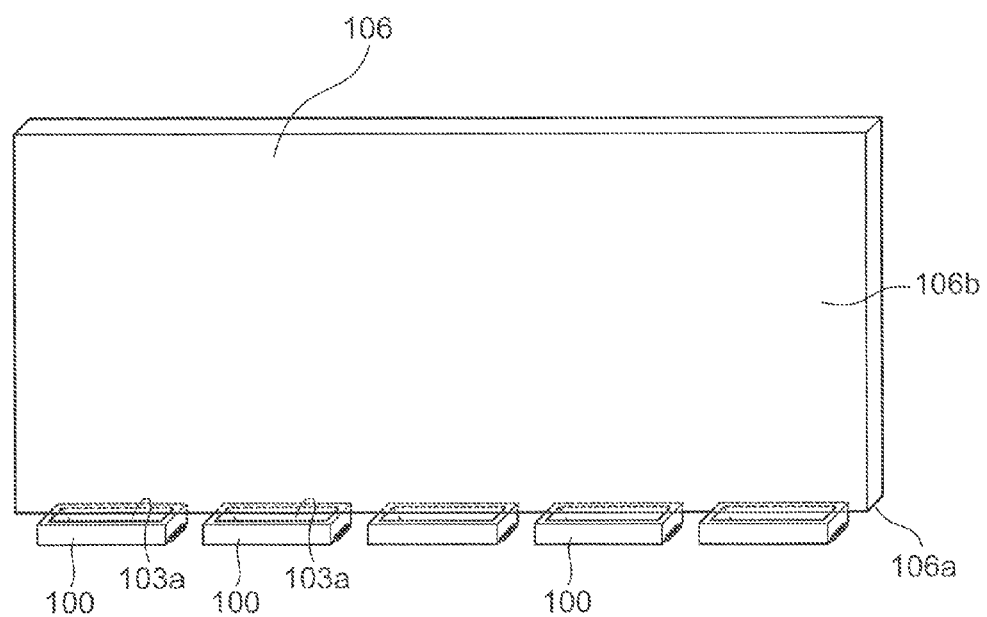
FIG. 7 shows a perspective view of a backlight device using the conventional light emitting devices.
Figure 8:
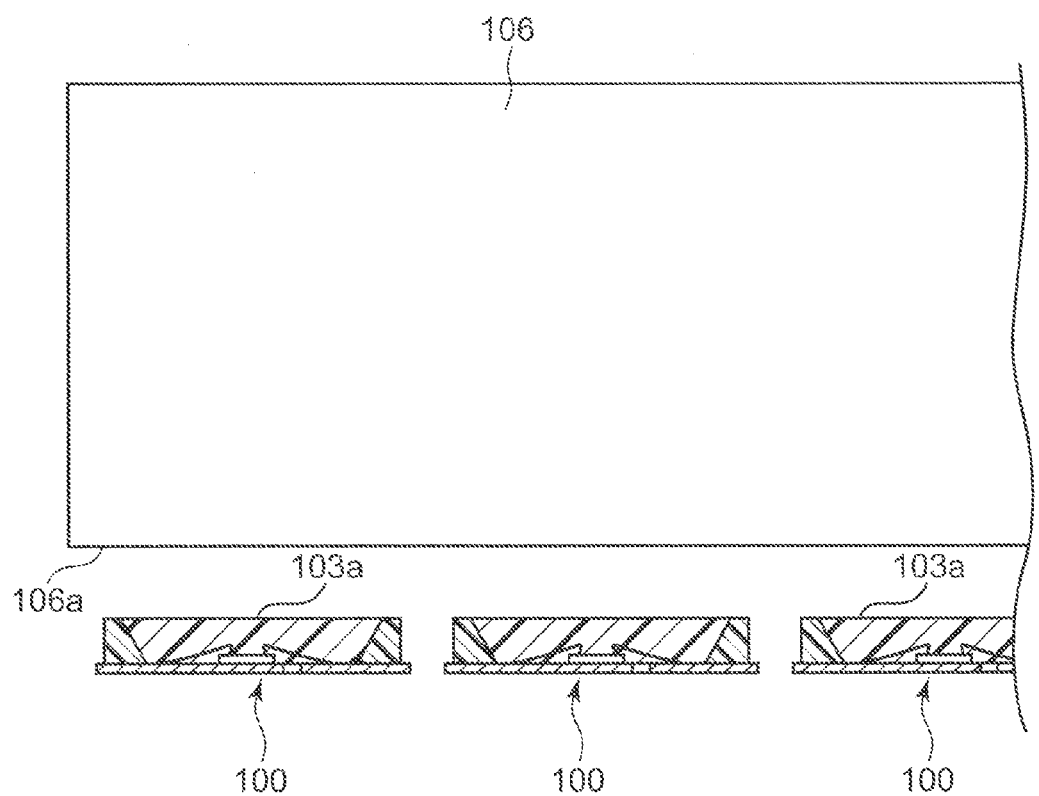
FIG. 8 shows a longitudinal sectional view of the backlight device.
Figure 11:
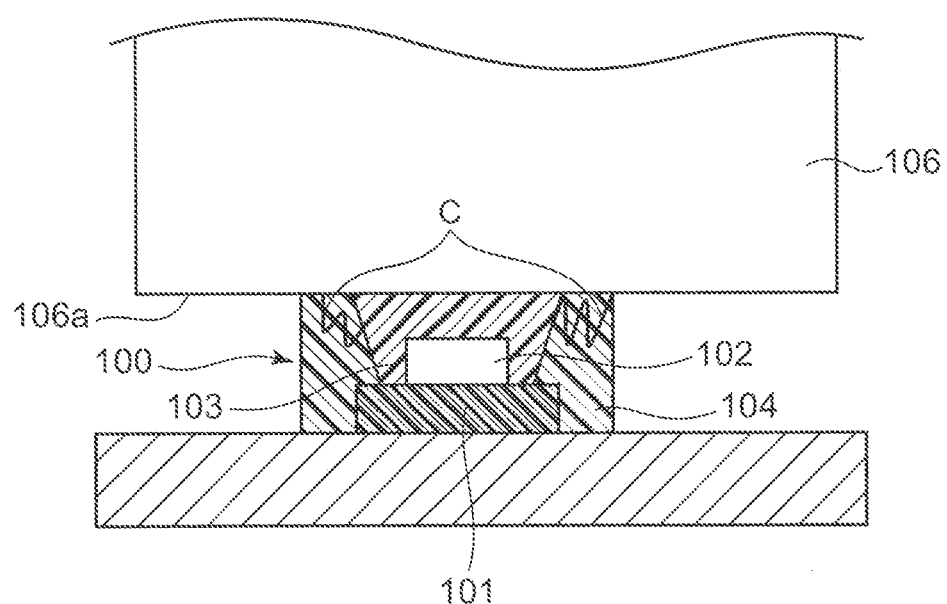
FIG. 11 shows an enlarged view of portion B in FIG. 10B.

More specifically, the light emitting devices 10 are mounted on a board 7. These light emitting devices 10 may be arranged in a line for example as shown in FIG. 7. An end surface 106a of the light guide body 106 is opposed to the upper end surfaces 3a of the sealing resins 3 of the light emitting devices 10. Light emitted through the upper end surface 3a of each sealing resin 3 is taken into the light guide body 106 through the end surface 106a thereof, then diffused and reflected on portions inside the light guide body 106, and taken out through a planar surface 106b of the light guide body 106. Light taken out through the planar surface 106b of the light guide body 106 is used as backlight. This backlight device is called an edge-type backlight.

As shown in FIG. 2A, the light guide member 106 is disposed close to the upper end surface 3a of the sealing resin 3 of each light emitting device 10. Thus, as described with reference to FIG. 9B, light from the light emitting device 10 is allowed to efficiently enter the light guide member 106.

Figure 2B:
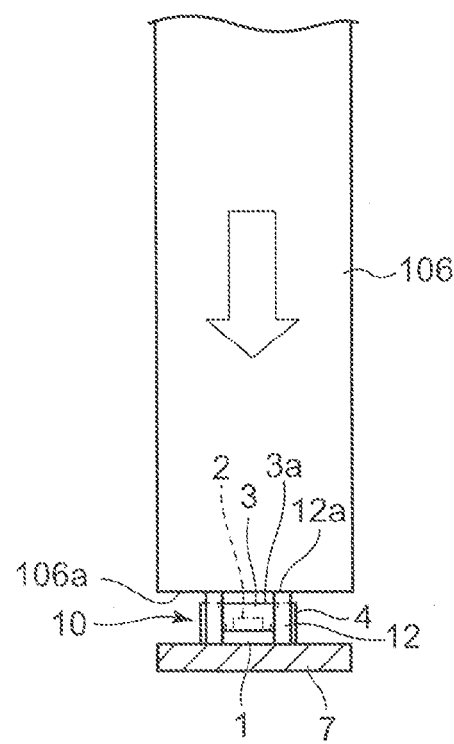
FIG. 2B shows a cross sectional view of the backlight device, showing the light guide body being in contact with the light emitting device.

If the light emitting device 10 is approached to the light guide bode 106 to the extent that the light emitting device 10 nearly touches the light guide body 106, when the light emitting element 2 turns on or a surrounding temperature rises, the light guide body 106 may thermally expand in the direction of arrow in FIG. 2B and collide against the light emitting device 10.

Figure 3:
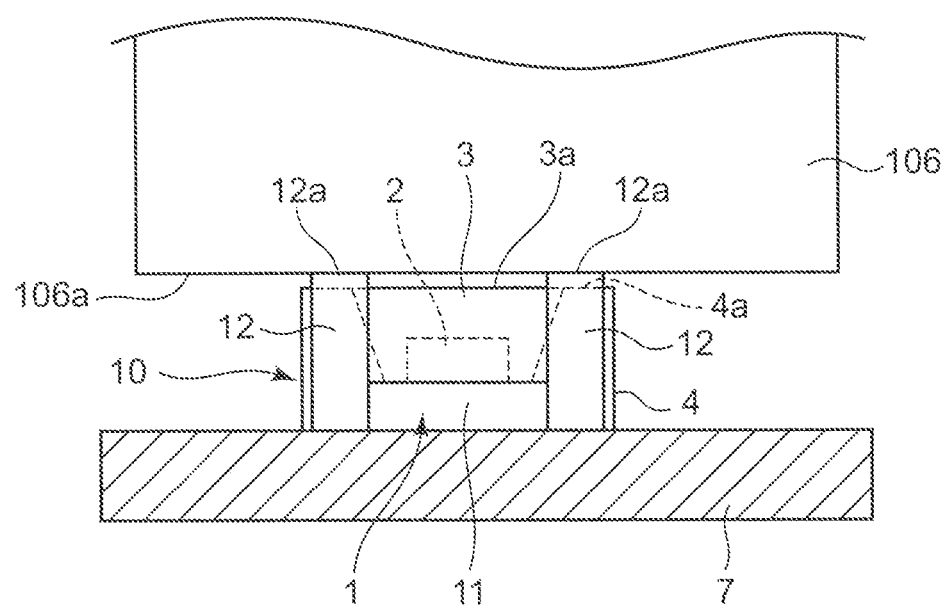
FIG. 3 shows an enlarged view of FIG. 2B.

In such an occasion, however, because the tip surfaces 12a of the bumper sections 12 are at a higher level than the upper end surface 4a of the case member 4, as shown in FIG. 3, the bumper sections 12 are brought into contact with the light guide body 106 and receive forces or loads from the light guide body 106. In this way, the bumper sections 12 prevent forces or loads of the light guide body 106 from being transmitted to the case member 4.

As a result, it is possible to prevent the case member 4 from suffering from damages such as cracks and hence to prevent the wires 5 (see FIG. 1B) within the case member 4 and the sealing resin 3 from breaking.

Accordingly, it is possible to place the light guide body 106 so close to the light emitting device 10 that light emitted from the light emitting device 10 can be efficiently led to the light guide body. At the same time, it is possible to prevent disconnection, or wire breaking, of the light emitting device 10 from occurring even if the light guide body 106 collides with the light emitting device 10 due to the thermal expansion.

Furthermore, the bumper sections 12 serve to reduce the thermal resistance of the light emitting device 10 by increasing not only the strength of the light emitting device 10 but also a total weight of the lead frame 1. In addition, due to reinforcement of the mechanical strength of the light emitting device 10 by the bumper sections 12, it is possible to select a resin material for the case member 4 from materials specialized for improvement of reflectance and prevention of discoloration due to long-term energization, even at the expense of the strength.

Also, because the bumper sections 12 are formed by bending portions of the lead frame 1, the bumper sections 12 can be made easily.

Also, because the bumper sections 12 are arranged to extend orthogonally, or perpendicularly to the lead frame body 11, a direction of forces of the thermally expanded light guide body 106 to be received by the bumper sections 12 can be consistent with the orthogonal direction in which the bumper sections 12 extend relative to the lead frame body 11. Therefore, the light guide body 106 is prevented from exerting loads of bending forces upon the bumper sections 12. As a result, the bumper sections 12 can reliably support or bear the light guide body 108.

Also, because the bumper sections 12 are connected to the terminal sections 11a, heat of the light emitting element 2 is discharged not only through the terminal sections 11a but also through the bumper sections 12.

The backlight device with the above arrangement, which includes the light emitting devices 10 as described above, provides good optical efficiency and avoids breaking of wires.

(Second Embodiment)

Figure 4A:
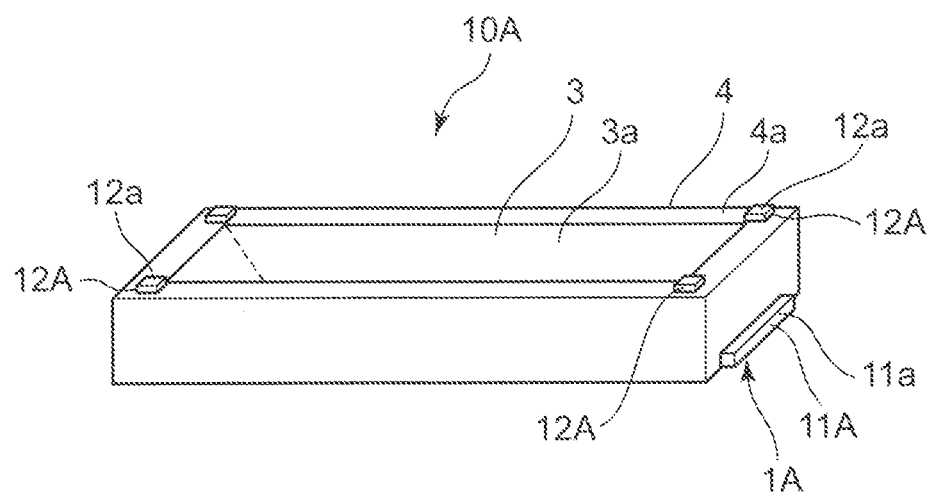
FIG. 4A shows a perspective view of a light emitting device according to a second embodiment of the present invention.
Figure 4B:
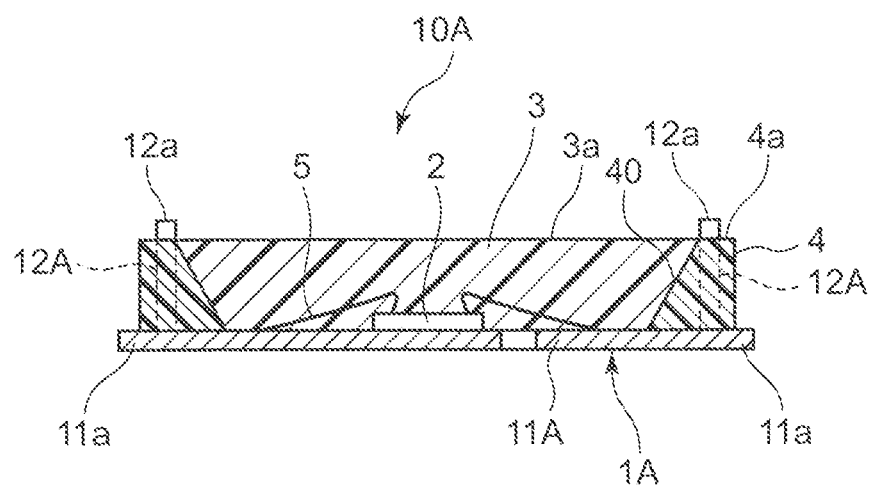
FIG. 4B shows a sectional view of the light emitting device of the second embodiment.

FIG. 4A shows a perspective view of a light emitting device according to a second embodiment of the present invention, and FIG. 4B shows a sectional view of the light emitting device. The second embodiment differs from the first embodiment in the positions of the bumper sections of the lead frame.

Those parts that are indicated by the same reference numbers in the first and second embodiments have same structures, so that description of those parts will be omitted here.

As shown in FIGS. 4A and 4B, the light emitting device 10A of the second embodiment has a lead frame 1A in which a lead frame body 11A has terminal sections 11a that protrude from each of opposed ends of the lead frame body along a surface direction. The terminal sections 11a are exposed from the case member 4. The lead frame body 11A is rectangular. The terminal sections 11a are provided at one of two pairs of opposed sides of the rectangular lead frame body 11A.

Bumper sections 12A are contiguous to, or connected to portions of the lead frame body 11A where the terminal sections 11a do not exist. The bumper sections 12A also penetrate the case member 4. The bumper sections 12A are not contiguous to the terminal sections 11a but contiguous to portions of the lead frame body 11A covered with the case member 4. The bumper sections 12A are embedded in the case member 4 with their tip surfaces 12a exposed from the upper end surface 4a of the case member 4.

The bumper sections 12A are arranged orthogonal, or perpendicular to the lead frame body 11A. Each bumper section 12A is formed by bending a part of the lead frame 1A by 90 degrees.

The bumper sections 12A are four in number, and these four bumper sections 12A are placed in the four corners of the rectangular case member 4.

The tip surfaces 12a of each of the bumper sections 12A are at a higher level than the upper end surface 4a of the case member 4. The upper end surface 4a of the case member 4 is flush with the upper end surface 3a of the sealing resin 3. The upper end surfaces 3a, 4a are surfaces directed to a direction to which light from the light emitting element 2 goes out.

The initial lead frame is diced by a so-called mapping scheme into individual pieces.

The light emitting device 10A with the above arrangement provides advantageous effects similar to those of the first embodiment. Besides, because the bumper sections 12A penetrate the case member 4, spaces for installation of the bumper sections 12A can be reduced.

(Third Embodiment)

Figure 5A:
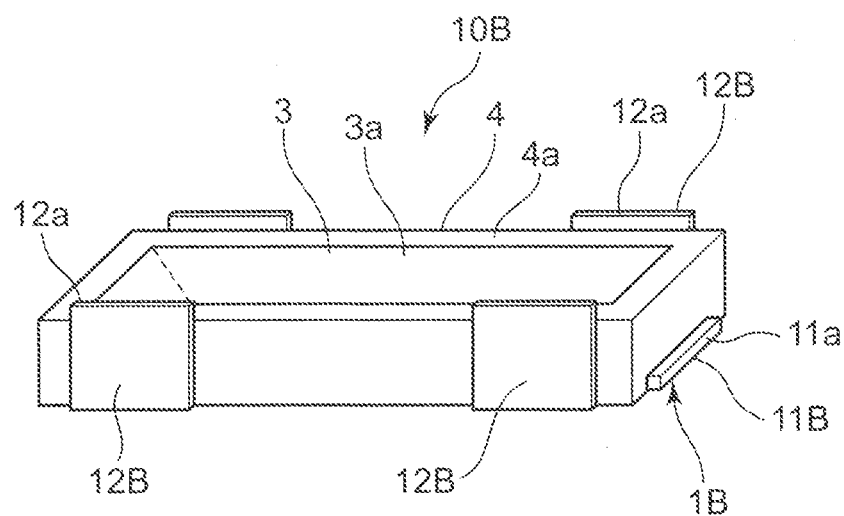
FIG. 5A shows a perspective view of a light emitting device according to a third embodiment of the present invention.
Figure 5B:
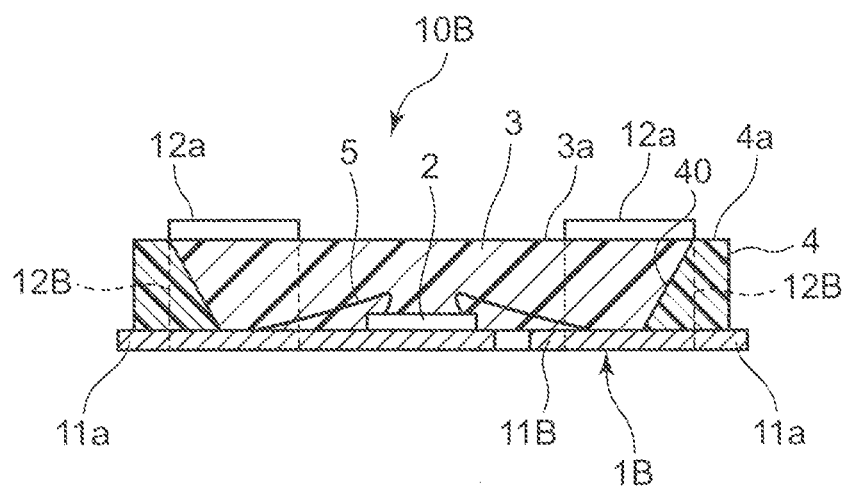
FIG. 5B shows a sectional view of the light emitting device of the third embodiment.
Figure 6A:
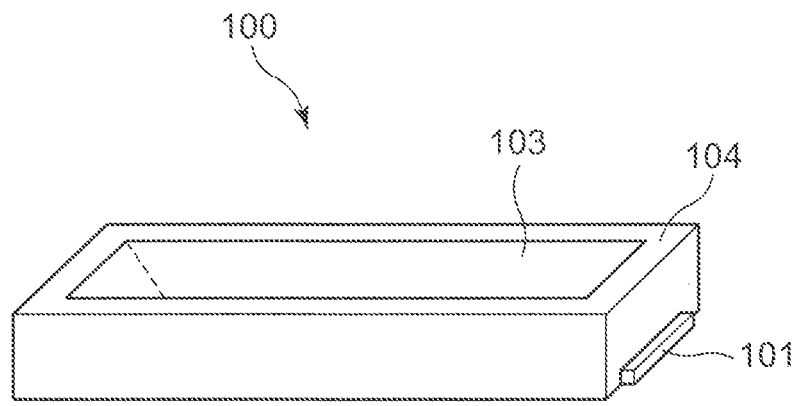
FIG. 6A shows a perspective view of a conventional light emitting device.
Figure 6B:
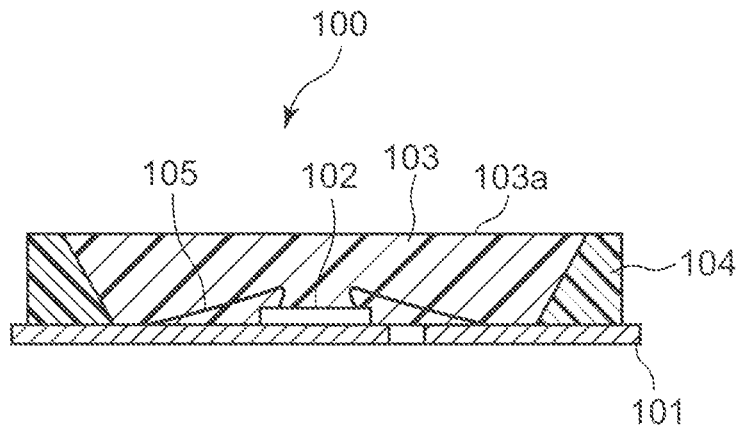
FIG. 6B shows a sectional view of the conventional light emitting device.

FIG. 5A shows a perspective view of a light emitting device according to a third embodiment of the present invention, and FIG. 5B shows a sectional view of the light emitting device. The third embodiment differs from the first embodiment in the positions of the bumper sections of the lead frame.

Those parts that are indicated by the same reference numbers in the first and third embodiments have same structures, so that description of those parts will be omitted here.

As shown in FIGS. 5A and 5B, the light emitting device 10B of the third embodiment has a lead frame 1B in which a lead frame body 11B has terminal sections 11a that protrude from each of opposed ends of the lead frame body along a surface direction. The terminal sections 11a are exposed from the case member 4. The lead frame body 11B is rectangular. The terminal sections 11a are provided at one of two pairs of opposed sides of the rectangular lead frame body 11B.

Bumper sections 12B are contiguous to, or connected to those portions of the lead frame body 11B where the terminal sections 11a do not exist. The bumper sections 12B are connected to the other pair of opposed sides of the lead frame body 11B in such a manner that they are exposed from the case member 4.

The bumper sections 12B are arranged orthogonal, or perpendicular to the lead frame body 11B. Each bumper section 12B is formed by bending a part of the lead frame 1B by 90 degrees.

The bumper sections 12B are four in number, and these four bumper sections 12B are placed outside of the four corners of the case member 4, which has a rectangular shape as viewed in a plan view thereof.

Tip surfaces 12a of each of the bumper sections 12B are at a higher level than the upper end surface 4a of the case member 4. The upper end surface 4a of the case member 4 is at a level equal to, or flush with the upper end surface 3a of the sealing resin 3. The upper end surfaces 3a, 4a are surfaces directed to a direction to which light from the light emitting element 2 goes out.

The light emitting device 10B with the above arrangement provides advantageous effects similar to those of the first embodiment. Besides, because the bumper sections 12B are contiguous to, or connected to portions of the lead frame body 11B where the terminal sections 11a do not exist, heat of the light emitting element 2 is discharged not only through the terminal sections 11a but also through the bumper sections 12B. Also, the light emitting device 10B can be placed with the bumper sections 12B facing downward, so that the light emitting device 10B can be used as a side-emission type light emitting device.

It should be understood that the present invention is not limited to the above embodiments. For example, the features of the first, second and third embodiments may be combined in various ways.

The height of the tip surfaces of the bumper sections may be equal to the height of the upper end surface of the case member. Also, the bumper sections may be disposed so as to meet the lead frame body at angles other than right angles.

The number of the bumpers may be optionally changed. The material of the case member may be other than resin. The configuration of the lead frame body may be optionally changed and the number of the terminal sections may also be optionally changed. Also, the above described light emitting devices may be used for light source devices other than the backlight device.

REFERENCE SIGNS LIST 1, 1A, 1B: lead frame,
2: light emitting element,
3: sealing resin, 3a: upper end surface,
4: case member,
4a: upper end surface,
40: hole
5: wire
10, 10A, 10B: light emitting device,
11, 11A, 11B: lead frame body,
11a: terminal sections,
12, 12A, 12B: bumper sections,
12a: tip surface,
106: light guide body, and
106a: end surface.

The invention claimed is:

1. A light emitting device comprising:
    a lead frame having a lead frame body and a plurality of bumper sections raised from the lead frame body;
    a rectangular case member having a bottom surface attached to the lead frame body, the case member also having a hole;
    a light emitting element placed in the hole of the case member, the light emitting element being mounted to the lead frame body; and
    a sealing resin filled in the hole of the case member and sealing the light emitting element,
    the bumper sections being arranged on two opposite sides of the case member,
    tip surfaces of the bumper sections being at a level higher than or equal to an upper end surface of the case member.

2. The light emitting device according to claim 1, wherein each bumper section has been formed by bending a portion of the lead frame.

3. The light emitting device according to claim 1, wherein the bumper sections are arranged orthogonal to the lead frame body.

4. The light emitting device according to claim 1, wherein the lead frame body has two terminal sections protruding along a surface direction from two opposite ends of the lead frame body, the terminal sections being exposed from the case member; and
    wherein the bumper sections are contiguous to the terminal sections.

5. The light emitting device according to claim 1, wherein the lead frame body has a terminal section protruding along a surface direction from an end of the lead frame body, the terminal section being exposed from the case member; and
    wherein the bumper sections are contiguous to portions of the lead frame body where the terminal section does not exist, and the bumper sections penetrate the case member.

6. The light emitting device according to claim 1, wherein the lead frame body has a terminal section protruding along a surface direction from an end of the lead frame body, the terminal section being exposed from the case member; and
    wherein the bumper sections are contiguous to two opposite end portions of the lead frame body where the terminal section does not exist, and the bumper sections are exposed from the case member.

7. A backlight device comprising:
    a light emitting device according to claim 1; and
    a light guide body placed so as to be opposed to an upper end surface of the sealing resin of the light emitting device.

8. The light emitting device according to claim 1, wherein the bumper sections are arranged in four corners of the case member or outside of the four corners.

* * * * *